US008148052B2

(12) United States Patent (10) Patent No.: US 8,148,052 B2
Vanleenhove et al. (45) Date of Patent: Apr. 3, 2012

(54) DOUBLE PATTERNING FOR LITHOGRAPHY TO INCREASE FEATURE SPATIAL DENSITY

(75) Inventors: Anja Monique Vanleenhove, Kessel-lo (BE); Peter Dirksen, Valkenswaard (NL); David Van Steenwinckel, Holsbeek (BE); Gerben Doornbos, Kessel-lo (BE); Casper Juffermans, Valkenswaard (NL); Mark Van Dal, Heverlee (BE)

(73) Assignee: NXP B.V., Eindhoven (NL)

( * ) Notice: Subject to any disclaimer, the term of this patent is extended or adjusted under 35 U.S.C. 154(b) by 398 days.

(21) Appl. No.: 12/514,777

(22) PCT Filed: Nov. 13, 2007

(86) PCT No.: PCT/IB2007/054604
§ 371 (c)(1),
(2), (4) Date: May 13, 2009

(87) PCT Pub. No.: WO2008/059440
PCT Pub. Date: May 22, 2008

(65) Prior Publication Data
US 2010/0028809 A1 Feb. 4, 2010

(30) Foreign Application Priority Data
Nov. 14, 2006 (EP) .................... 06124035

(51) Int. Cl.
*G03F 7/26* (2006.01)
(52) U.S. Cl. ........ 430/315; 430/311; 430/328; 430/394; 430/330
(58) Field of Classification Search .................. 430/312, 430/394, 315, 314, 328
See application file for complete search history.

(56) References Cited

U.S. PATENT DOCUMENTS
4,425,416 A 1/1984 Ogawa
(Continued)

FOREIGN PATENT DOCUMENTS
DE 44 10 274 A1 8/1995
(Continued)

OTHER PUBLICATIONS
Hsu, Stephen, et al; "Double Exposure Technique for 45nm Mode and Beyond, V.3"; ASML Mask Tools; Santa Clara, CA, USA; pp. 1-16; Oct. 28, 2005.
(Continued)

*Primary Examiner* — Kathleen Duda
*Assistant Examiner* — Caleen Sullivan

(57) ABSTRACT

A method of forming a pattern in at least one device layer in or on a substrate comprises: coating the device layer with a first photoresist layer; exposing the first photoresist using a first mask; developing the first photoresist layer to form a first pattern on the substrate; coating the substrate with a protection layer; treating the protection layer to cause a change therein where it is in contact with the first photoresist, to render the changed protection layer substantially immune to a subsequent exposure and/or developing step; coating the substrate with a second photoresist layer; exposing the second photoresist layer using a second mask; and developing the second photoresist layer to form a second pattern on the substrate without significantly affecting the first pattern in the first photoresist layer, wherein the first and second patterns together define interspersed features having a spatial frequency greater than that of the features defined in each of the first and second patterns separately. The process has particular utility in defining source, drain and fin features of finFET devices with a smaller feature size than otherwise achievable with the prevailing lithography tools.

17 Claims, 7 Drawing Sheets

U.S. PATENT DOCUMENTS

| | | | |
|---|---|---|---|
| 5,091,290 | A | 2/1992 | Rolfson |
| 5,679,498 | A | 10/1997 | Greenwood |
| 5,686,223 | A | 11/1997 | Cleeves |
| 6,015,650 | A | 1/2000 | Bae |
| 7,253,118 | B2 | 8/2007 | Tran et al. |
| 7,592,132 | B2 | 9/2009 | Takahashi et al. |
| 7,651,951 | B2 | 1/2010 | Tran et al. |
| 7,718,540 | B2 | 5/2010 | Tran et al. |
| 8,048,812 | B2 | 11/2011 | Tran et al. |
| 2005/0123858 | A1 | 6/2005 | Ito et al. |
| 2010/0035177 | A1* | 2/2010 | Ishikawa et al. ............ 430/270.1 |

FOREIGN PATENT DOCUMENTS

| | | |
|---|---|---|
| DE | 103 05 618 A1 | 9/2004 |
| EP | 1 100 120 A | 5/2001 |
| EP | 1 223 470 A1 | 7/2002 |
| JP | 55-138839 | 10/1980 |
| JP | 58-127326 | 7/1983 |
| JP | 63-170917 | 7/1988 |
| JP | 04-071222 | 3/1992 |
| JP | 06-250379 | 9/1994 |
| JP | 11-283905 | 10/1999 |
| JP | 11-283910 | 10/1999 |
| JP | 2004296930 A | 10/2004 |
| WO | 02095498 A2 | 11/2002 |
| WO | 2008/038526 A | 4/2008 |

OTHER PUBLICATIONS

Ebihara, Takeki, et al; "Beyond K1=0.25 Lithography : 70nm L/S Patterning Using KrF Scanners"; Society of Photo-Optical Instrumentation Engineers; 2003; pp. 1-10.

Owe-Yang, D.C., et al; "Double Exposure for the Contact Layer of the 65-nm Node"; Proceedings of SPIE vol. 5753; Bellingham WA, 2005; p. 171-180.

Lim, Chang-Moon, et al; "Positive and Negative Tone Double Patterning Lithography for 50nm Flash Memory"; pp. 1-8; Unknown.

Maenhoudt, M., et al; "Double Patterning Scheme for Sub-0.25 k1 Single Damascene Structures at NA=0.75, $\lambda$=193nm"; pp. 1-11; Unknown.

Brueck, Steven R. J., et al; "Extension of 193-nm Immersion Optical Lithography to the 22-nm Half-Pitch Node"; Proceedings of SPIE vol. 5377; p. 1315-1322; Bellingham, WA, (2004).

Nakamura, Hiroko, et al; "Contact Hole Formation by Multiple Exposure Technique in Ultra-Low K1 Lithography"; Proceedings of SPIE vol. 5377; Bellingham, WA; 1994; pp. 255-263.

* cited by examiner

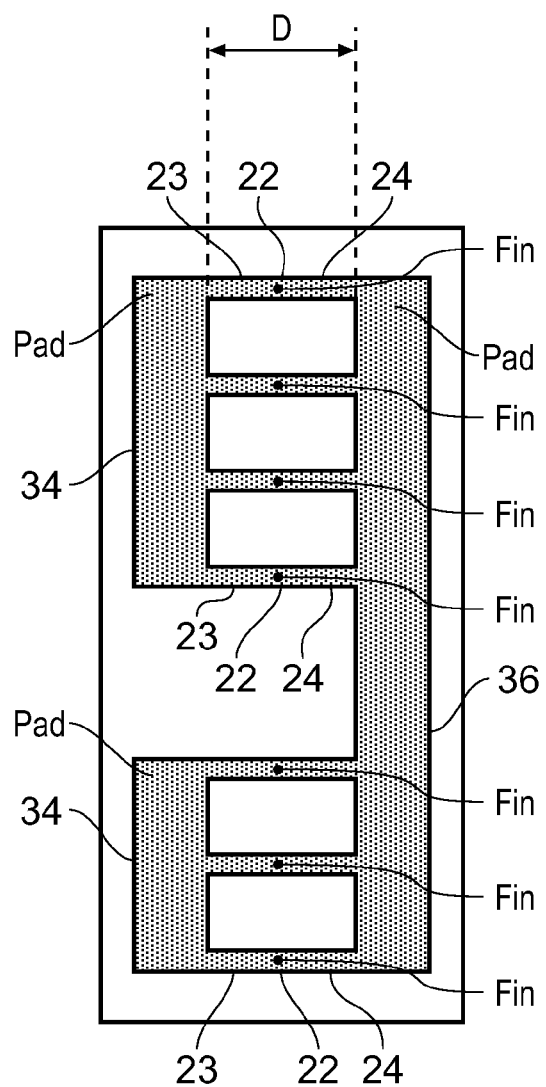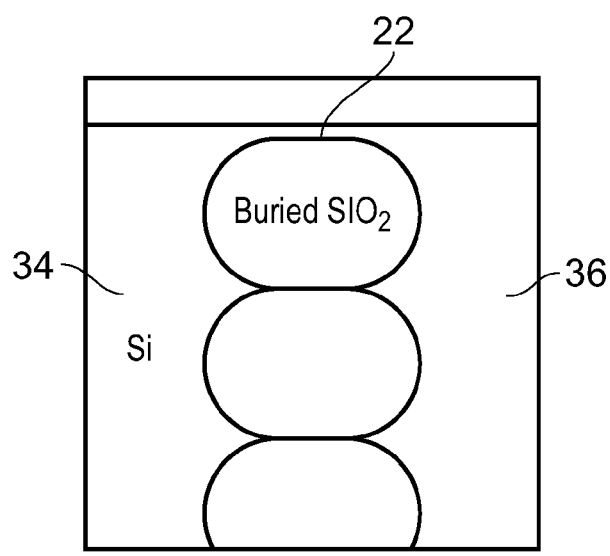
FIG. 4A
FIG. 4B

DOUBLE PATTERNING FOR LITHOGRAPHY TO INCREASE FEATURE SPATIAL DENSITY

The present invention relates to integrated circuit manufacture and in particular to techniques for increasing the spatial density of features defined using lithography.

To achieve higher device densities in integrated circuit manufacture, lithography processes are required to print ever smaller feature sizes and pitch between features. Several solutions are known in the art to extend the range of lithography processes to smaller feature sizes and pitches.

One solution is to decrease the wavelength of radiation used to expose and pattern the photoresists used, for example into the deep ultraviolet (DUV), far UV (FUV) or extended ultraviolet (EUV) ranges. The DUV spectrum may be considered to refer to wavelengths below 300 nm, the FUV spectrum may be considered to refer to wavelengths below 200 nm and the EUV spectrum may be considered to refer to wavelengths below 31 nm and particularly encompassing the 13.5 nm wavelength. This requires fundamental and expensive changes in the infrastructure used to perform the lithography and for some types of integrated circuit features may not in itself be sufficient to resolve required feature sizes. In addition, photoresists specially adapted to work at one or more of the DUV, FUV and EUV ranges can sometimes result in significant other limitations.

Another solution that has been proposed in the art to reduce feature pitch obtainable with lithographic processes is to perform multiple exposures of photoresists prior to defining the features in the layer or layers underlying the exposed and developed photoresists. For example, as described in U.S. Pat. No. 5,686,223, a substrate in or on which features are to be defined is coated with a first resist, exposed with a first mask and developed to produce a first pattern in the photoresist. The first photoresist pattern is then stabilised. A second photoresist is coated onto the substrate, exposed with a second mask and developed to produce a second pattern in the photoresist. The first and second patterns may be selected so that each has features at twice the pitch ultimately required, the combined pattern providing interspersed features at the desired pitch. The substrate can then be processed (e.g. etched) where not protected by the first and second photoresist patterns thereby defining the desired features at half the pitch of either photomask.

Of course, the first photoresist pattern has to be stabilised so that it remains substantially unaffected by the exposure and developing steps of the second photoresist, otherwise it would be again at least partially exposed and developed away with the second photoresist. U.S. Pat. No. 5,686,223 proposes stabilisation of the first patterned photoresist layer using a DUV exposure in the wavelength range 200 to 400 nm. This technique therefore tends to be incompatible with photoresists specially adapted to work at the DUV, FUV and/or EUV ranges.

The present invention provides an improved process for double patterning photoresist layers in order that features can be defined on a substrate with a higher spatial frequency (e.g. smaller pitch) than is possible with a single mask.

According to another aspect, the present invention provides a method of forming a pattern in at least one device layer in or on a substrate comprising the steps of:
a) coating the device layer (10) with a first photoresist layer (11);
b) exposing the first photoresist using a first mask;
c) developing the first photoresist layer to form a first pattern (12) on the substrate;
d) coating the substrate with a protection layer (13);
e) treating the protection layer to cause a change therein where it is in contact with the first photoresist (11), to render the changed protection layer (15) substantially immune to a subsequent exposure and/or developing step;
f) coating the substrate with a second photoresist layer (16);
g) exposing the second photoresist layer using a second mask; and
h) developing the second photoresist layer (16) to form a second pattern (17) on the substrate without significantly affecting the first pattern (12) in the first photoresist layer,
i) wherein the first and second patterns (12, 17) together define interspersed features having a spatial frequency greater than that of the features defined in each of the first and second patterns separately.

Embodiments of the present invention will now be described by way of example and with reference to the accompanying drawings in which:

FIGS. 1-1 to 1-8 comprise a set of schematic cross-sectional diagrams illustrating a double patterning process;

FIG. 4a shows a conventional lithography mask suitable for defining features of the finFET structures of FIG. 3;

FIG. 4b shows a micrograph of features defined using the mask of FIG. 4b when subject to optical proximity effects using prior art processes;

FIG. 6b is a schematic plan view of a complementary pair of finFET devices on a substrate with fins spaced at a second spatial frequency twice that of the devices of FIG. 6a;

Figure 1:
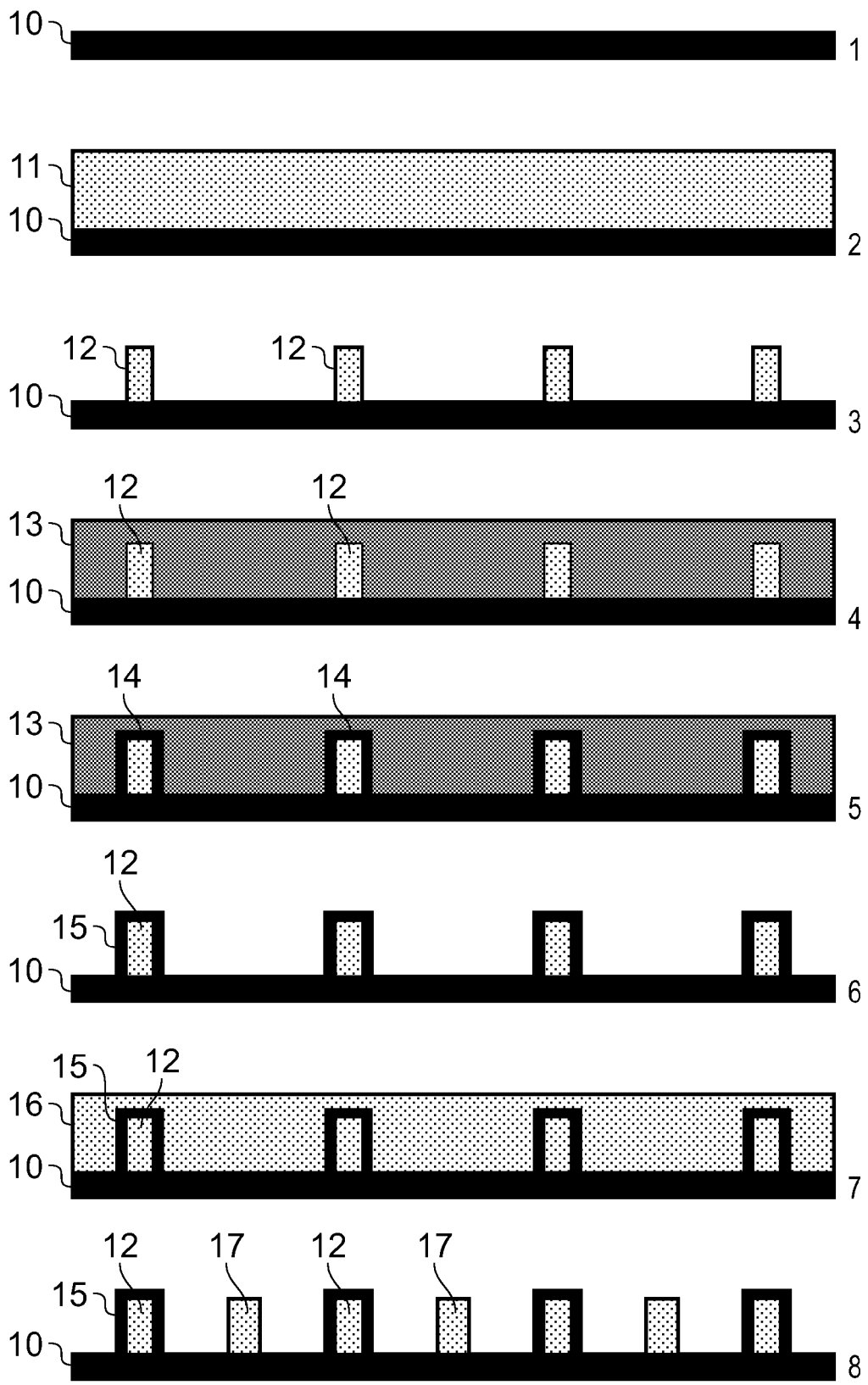

FIG. 1 provides schematic cross-sectional diagrams illustrating a process sequence for a double patterning technique. FIG. 1-1 shows a device layer 10 of a substrate ready for lithographic processing. Throughout the present specification, unless explicitly stated otherwise, the expression 'substrate' is used to refer not only to the original (e.g. silicon wafer) substrate, but also to include any subsequently deposited and/or defined layers up to the relevant point in the process being described. Thus, the device layer 10 in FIG. 1-1 may comprise the top portion of a basic silicon or other semiconductor wafer or other raw substrate suitable for the formation of integrated circuits, or an uppermost device layer of one that has already been processed with earlier deposited and/or defined layers, e.g. from earlier lithography steps.

Thus it will be understood that the device layer 10 need not necessarily be planar, particularly if it includes earlier patterned layers or topographical features that have not been planarized.

Figure 2:
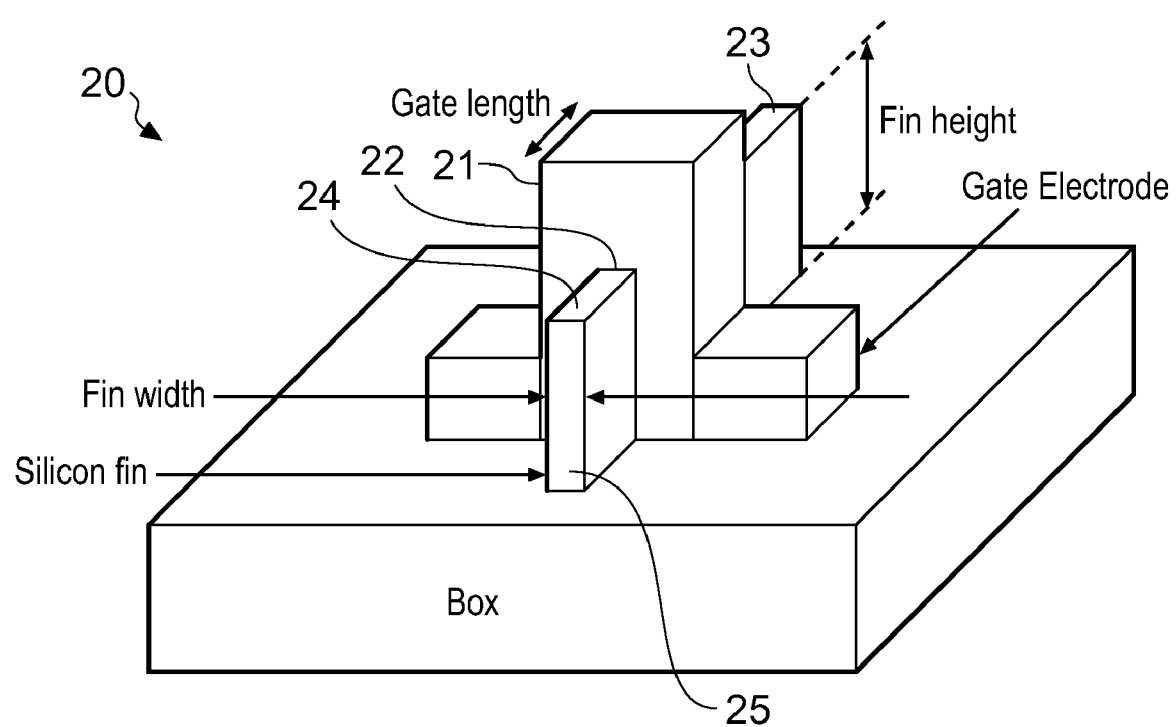
FIG. 2 is a perspective schematic diagram of a finFET device suitable for fabrication using the process of FIG. 1.
Figure 3:
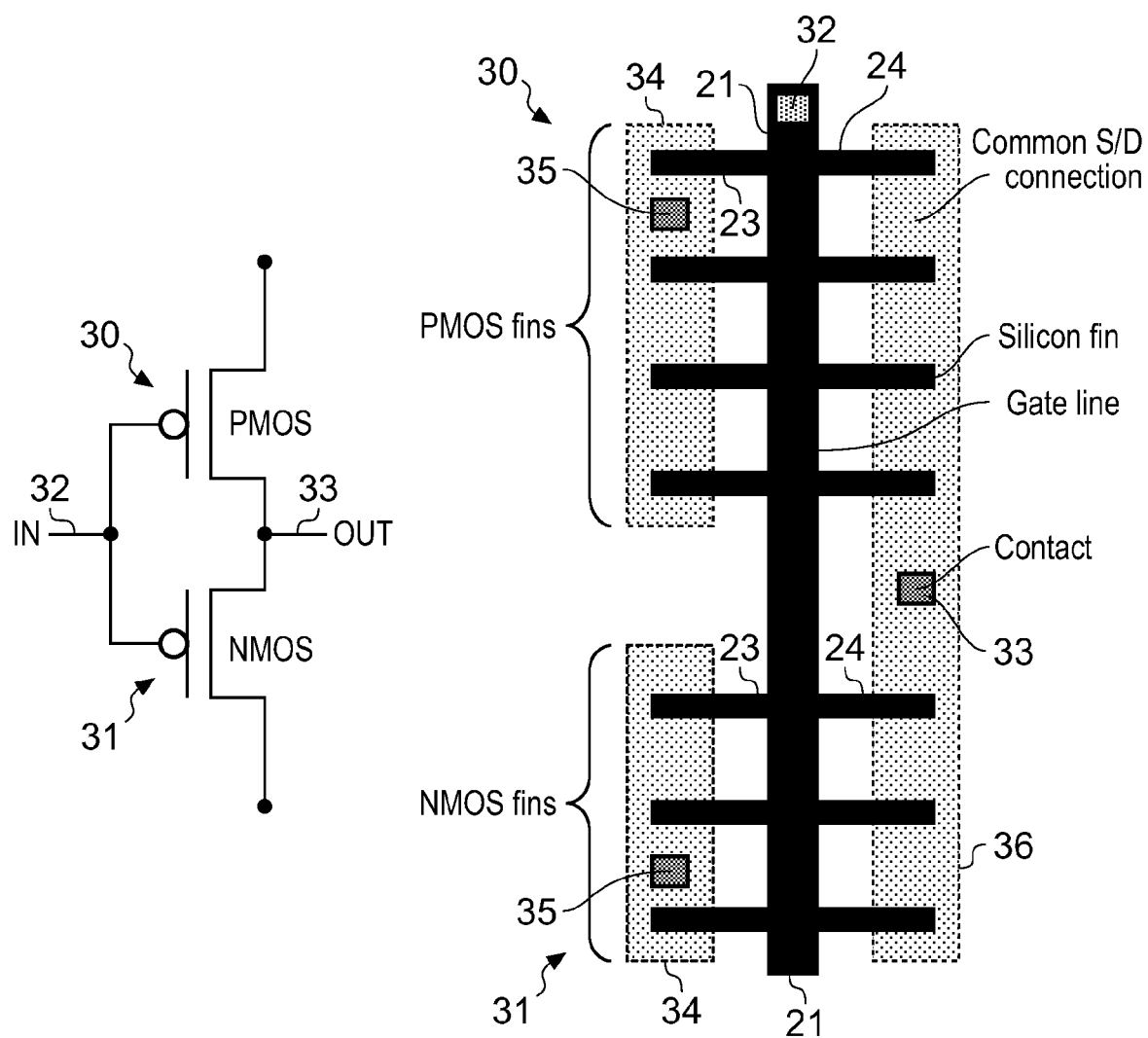
FIG. 3 is a schematic plan view of a complementary pair of finFET devices on a substrate in an inverter configuration together with the equivalent circuit diagram shown to the left.

As shown in FIG. 1-2, the device layer 10 is coated with a first photoresist layer 11, for example using conventional spin coating techniques. The first photoresist layer 11 is then exposed using a photomask with a suitable pattern and developed to wash away the unwanted portions of the photoresist 11 leaving a first photoresist pattern 12 on the substrate as shown in FIG. 1-3. It will be understood that the photoresist may be of the positive or negative type such that the pattern 12 may be respectively a positive or negative image of the mask used.

Referring now to FIG. 1-4, the substrate is coated with a protection layer 13. The protection layer 13 can be any material which is capable of undergoing suitable modification of its physical and/or chemical properties in regions where it is in contact with the first photoresist layer such that, in its modified form, it becomes substantially immune to a subsequent exposure and/or developing step of a second photoresist layer, to be described. Examples of suitable materials for the protection layer 13 include CSX004 from JSR Corporation, RELACS™ from AZ Electronic Materials USA Corporation, WASOOM from Clariant Corporation or other chemical shrink materials. These materials can also be applied using suitable known spin coating techniques.

After coating the substrate with the protection layer 13, the substrate is preferably baked to an extent that a cross-linking reaction takes place in the protection layer in regions (14) that are in contact with the underlying patterned first photoresist 12. The expression 'in contact with' encompasses 'in close proximity with' sufficient to initiate the cross-linking process, thereby forming a protection cap on the top and sidewalls of the first photoresist pattern 12.

In a preferred process, the protection layer 13 is baked in a suitable ambient according to the material used, preferably at a temperature in the range 135° C. to 165° C. and preferably for a time of 60 to 90 seconds or longer. As shown in FIG. 1-5, this results in a protection cap 15 of cross-linked material that is substantially immune to subsequent exposure and/or develop processes. In a preferred process, the resulting protection cap has a thickness in the range 5 to 15 nm so that the lines thicken by 10 to 30 nm. Thus, the unreacted protection layer 13 can then be washed away, e.g. by a suitable developer leaving the first resist pattern 12 with protective cap 15 only, as shown in FIG. 1-6.

As shown in FIG. 1-7, the resulting substrate is then coated with a second photoresist layer 16, for example using conventional spin coating techniques. The second photoresist layer 16 is then exposed using a second photomask with a suitable pattern and developed to wash away the unwanted portions of the photoresist 16 leaving a second photoresist pattern 17 on the substrate as shown in FIG. 1-8. It will be understood that the second photoresist may be of the positive or negative type such that the pattern 17 may be respectively a positive or negative image of the mask used.

It can be seen from FIG. 1-8 that the first and second mask patterns that define the first and second patterns 12, 17 in the two photoresist layers can be arranged each to have half the spatial frequency of features as provided in the final double exposed and developed pattern. The pitch or spacing of the individual features in the double exposed and developed pattern of FIG. 1-8 is half that of the single exposed and developed pattern of FIG. 1-3. More generally, it can be seen that the first and second patterns 12, 17 together define interspersed features having a spatial frequency greater than that of the features defined in each of the first and second patterns 12, 17 separately.

The device layer 10 can then be processed using the first and second photoresist patterns 12, 17 according to known semiconductor processing techniques, e.g. etching of the device layer 10 or implantation of designated impurities into the device layer, where not protected by the photoresist.

Although FIG. 1-8 shows the protection cap 15 remaining in place ready for subsequent processing of the device layer 10, it will be understood that this cap could be removed prior to processing the device layer 10 by a suitable develop or strip process that is selective for the protection cap while leaving the patterned photoresist layers 12, 17 substantially unaffected. This ensures that the lines of the first and second photoresist patterns 12, 17 can have the same dimensions.

Alternatively, a second protective cap could be formed on the second photoresist patterns 17 to achieve the same line dimensions as the first capped photoresist patterns. In this regard, it will be recognised that although the second protective cap when deposited onto the substrate will also coat the first patterns 12, there will be no interaction with the underlying photoresist as there will be a barrier in the form of the already chemically modified first protection layer.

In a preferred process, the cross-linking in the protection layer 13 is effected or promoted by a catalyst that is provided from the first patterned photoresist layer 12. For example, this may be an acid which diffuses, to a limited extent, from the first patterned photoresist layer 12 into the protection layer and renders the cross-linked protection layer insoluble to developer. The first photoresist layer may be an acrylate based photoresist.

The process as described above has particular advantages in applicability to DUV, FUV and XUV resist chemistries. As indicated earlier with reference to U.S. Pat. No. 5,686,223, prior art double patterning processes relied on stabilising the first patterned resist layer by exposure to a DUV light source to stabilise the resist against chemical transformation as a result of further exposure to radiation at the photosensitive wavelength of the second photoresist. Where DUV, FUV and XUV sensitive resists are themselves being used for the first and second patterns 12, 17, this is clearly not possible. In preferred processes, the resists being used for generating the first and second photoresist patterns are adapted for patterning using electromagnetic radiation in the DUV, the FUV spectrum or the XUV spectrum. In a particular preferred process, at least the first photoresist is adapted for patterning using electromagnetic radiation in the spectrum below 200 nm.

The process described above has particular, though not exclusive application in the formation of high density finFET devices, as will now be described. FinFET devices are field effect transistors in which the source and drain regions appear as fins on either side of the channel.

FIG. 2 shows a perspective view of a conventional finFET device 20 while FIG. 3 shows a plan view of a series connected finFET complementary pair, each of which is formed from plural fins connected in parallel. In the finFET device 20, the gate 21 wraps around the channel region 22 and the source and drain regions 23, 24 extend from the gate region in a fin-shaped configuration as best seen in FIG. 3. The gate electrode 21 effectively defines a channel in the two side walls and top surface of the fin structure covered by the gate electrode. In finFET technology, the effective transistor width W is determined by the geometry of the fins and the number N of fins per transistor: $W = N*(2h_{fin} + w_{fin})$ where $w_{fin}$ and $h_{fin}$ are the fin width and fin height respectively, as shown in FIG. 2. The gate length $L_{gate}$ is determined by the width of the gate electrode stripe 21. Typical dimensions in existing technologies are of the order of $w_{fin} = 10$ nm, $h_{fin} = 60$ nm and $L_{gate} = 30$ nm. Current flows within the channel adjacent the two side walls and the top surface giving an effective gate width of $2h_{fin} + W_{fin}$.

Where a transistor is formed from plural fins connected in parallel, e.g. PMOS transistor 30 or NMOS transistor 31 of FIG. 3, the individual source and drain fins must be connected. Also, in digital standard cells such as the series connected complementary pair in FIG. 3, common source/drain contacts must be connected. In the CMOS inverter of FIG. 3, represented by the circuit diagram to the left of the figure, a p-FET and an n-FET are connected in series with the shared gates 21 forming an input node 32 and the shared drains 24 forming an output node 33. The p-FET comprises four parallel fins while the n-FET comprises three parallel fins. More generally, the finFETs may be formed from any appropriate number of fins.

The sources 23 must be electrically connected by common source regions 34 and the drains 24 must be electrically connected by common drain regions 36 to which the contact nodes 35 and 33 may be respectively provided. A conventional method for defining the sources 23, the common source regions 34, the drains 24 and the common drain regions 35 all in a suitable silicon layer 25 is shown in FIG. 4a.

A single silicon definition step provides the channel 22, the source fins 23, the drain fins 24, the common source regions 34 and the common drain region 36 with a single lithography mask having the layout as shown in the image of FIG. 4a. However, at very small geometries, the small distance D (FIG. 4a) between the common source and drain regions 34, 36 results in optical proximity effects causing rounding of the corners and line width variations, both inter-fin and intra-fin as seen in the micrograph of FIG. 4b. These variations directly impact the threshold voltage and drive current often leading to unacceptable degradation of circuit performance, particularly for small geometries.

Although these optical proximity effects can sometimes be corrected or mitigated using optical correction techniques, e.g. by modifying the pattern on the mask, often these are not entirely successful and also have limits to their effectiveness at small geometries.

The double patterning technique described above can be used to reduce the optical proximity effects and thus thereby also extend the process technology to smaller geometry finFET devices in two different ways.

Figures 5A, 5B, 5C:
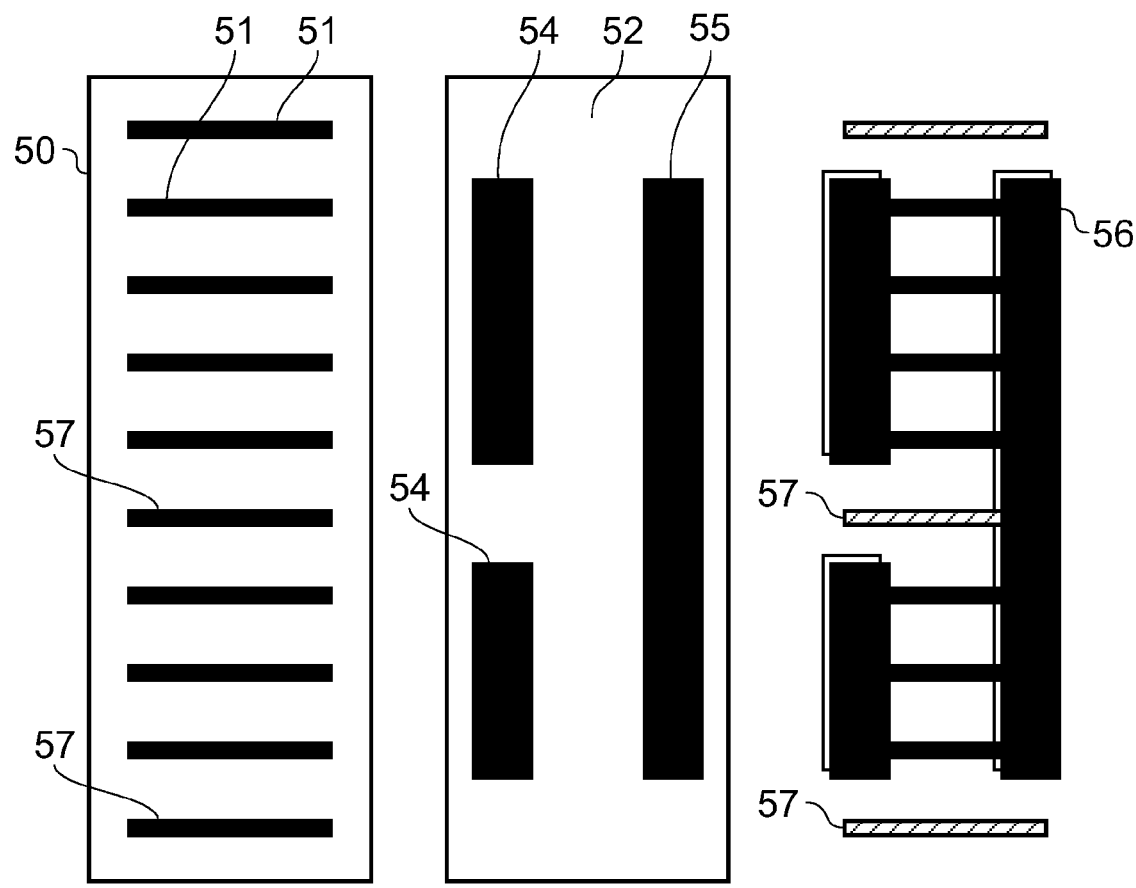
FIGS. 5a and 5b show first and second lithography masks suitable for a double patterning process used to define features of the finFET structures of FIG. 3.
FIG. 5c shows the resulting resist pattern using the masks of FIGS. 5a and 5b with a double patterning process.

A first way is shown in FIGS. 5a to 5c. In this process, the horizontal and vertical structures are lithographically defined in resist in two separate steps. A first mask 50 as shown in FIG. 5a is used to define the fins 51 and a second mask 52 as shown in FIG. 5b is used to define the common source and drain regions 54, 55 (e.g. regions 34, 36 of FIG. 4a). It will be understood that the expressions 'horizontal' and 'vertical' structures refer to their axial orientation within the x-y plane of the device as shown in the figures. More generally, the expressions are intended to encompass first and second groups of structures that have their long axes and/or critical dimensions aligned substantially orthogonal to one another.

As described in connection with FIG. 1, a first resist layer is exposed with the first mask 50 and developed to leave a corresponding fin pattern 51 in the first resist layer. The patterned first resist layer is then covered with the protection cap 15 (FIGS. 1-5 and 1-6). The substrate is then coated with a second resist layer and this second resist layer is exposed with the second mask 52 and developed to leave a corresponding source and drain region pattern 54, 55 in the second resist layer. The combined resist pattern is shown in FIG. 5c which can then be etched into the silicon or other device layer to form a single active layer containing the channel 22, the fin sources and drains 23, 24 and the common source and drain regions 34, 36.

This process offers a significant advantage in that only a single etch process is required to form all of the regions 22, 23, 24, 34, 36 in one active layer. As seen in FIG. 5, the separation of the fin element lithography from the source drain region lithography means that a highly regular pattern of fins can be defined all of equal pitch which provides significant benefits in the control of optical proximity effects and provides for the maximum control of the critical dimension of fin width. This can even include the use of 'dummy' fins 57 which will not ultimately form an electrically active part of a transistor, but which enhance control of the optical exposure of the first mask.

The further possible advantage is illustrated in FIG. 5c which shows, in shadow outline, the effects of mis-registration of the first mask and the second mask where it will be seen that has low impact on the device critical dimensions.

Thus, in a general aspect, the arrangement of FIG. 5 illustrates a general method for fabrication of a finFET structure in which the first mask 50 defines the fins 22, 23, 24, 51 of one or more finFETs and in which the second mask 52 defines common source regions 34 and common drain regions 36 that interconnect the fins in the same device layer, where required. Features of multiple adjacent finFETs can be defined while maintaining a substantially constant pitch both within individual finFET devices and between adjacent devices. For example, the pattern of mask 50 defining the fins 51 may continue with the same periodicity for adjacent finFETs.

As will be seen in FIG. 5b, the second mask 52 can provide breaks at suitable points to separate adjacent finFETs. Selected fins will therefore remain unconnected as shown by the two separate source regions 54.

More generally still, the double patterning technique in this context can be applied to the fabrication of any device structure in which a first mask is configured to define horizontal features in a layer of the device and in which a second mask is configured to define vertical features in the same layer of the device. These horizontal and vertical features are arranged to intersect at appropriate locations.

It will be recognised that the effect of this segregation of horizontal and vertical component features is that after double patterning, the vertical features are interspersed among the horizontal features such that the features together define a two dimensional spatial frequency that is greater than that of the features defined in each of the first and second patterns separately. In effect, the high frequency spatial components of the mask pattern in e.g. the x-direction are separated from the high frequency spatial components of the pattern in the y-direction by resolving them to separate masks. Combining the two masks in a double patterning process restores the higher spatial frequency components of both dimensions.

A second way of using the double patterning technique described above to extend the process technology to smaller geometry finFET devices is described in connection with FIGS. 6 and 7.

Figure 6A:
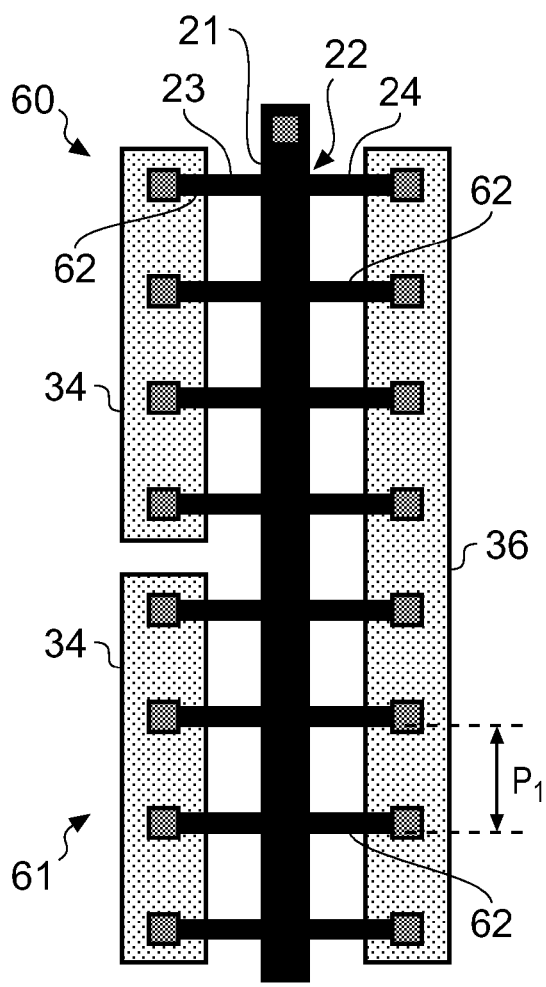
FIG. 6a is a schematic plan view of a complementary pair of finFET devices on a substrate with fins spaced at a first spatial frequency.

FIG. 6a shows a series connected complementary pair of finFETs 60, 61 similar to those shown in FIG. 3. Each finFET is formed from plural fins 62 connected in parallel. In the finFET device 60, the gate 21 wraps around the channel region 22 and the source and drain regions 23, 24 extend from the gate region in the fin-shaped configuration. The individual source fins 23 are again electrically connected with common source regions 34 and the drain fins 24 electrically connected by common drain regions 36 to which the contact nodes may be provided.

Figure 6B:
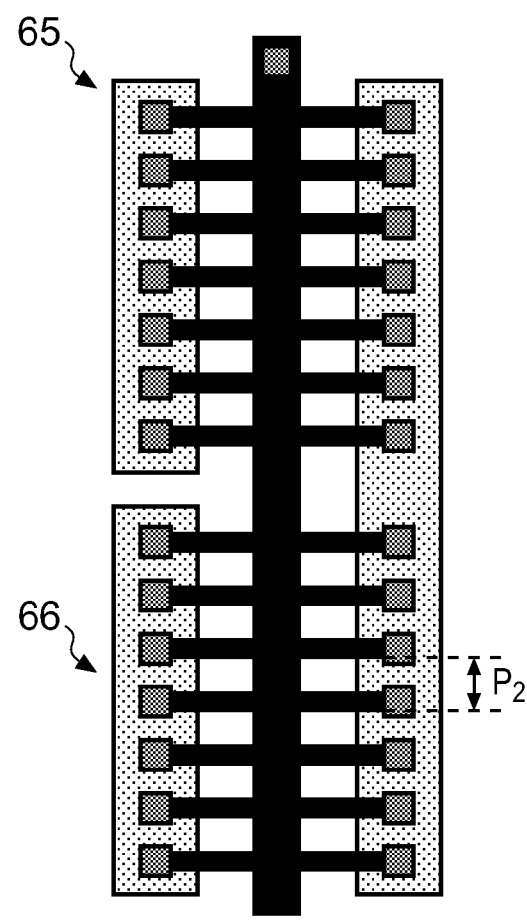

It will be noted that the fin pitch P1 of the transistors of FIG. 6a may be at the limit of the optical lithography tools being used when patterned using a single mask. By using the double patterning technique described above, it is possible to pattern the substrate twice with fins, each pattern having a pitch of P1 but offset by a distance $p_1/2$ and thereby producing a double patterned resist mask with pitch $p_2=p_1/2$. A resulting finFET structure is shown in FIG. 6b.

It will be seen that the number of fins per finFET in the circuit has been increased from four to seven, thereby increasing the drive strength by 75%. In interconnect-dominated circuitry, this increase in drive strength is directly reflected in a similar circuit speed enhancement. The finFETs of FIG. 6b can be produced with fin pitch $p_2$ significantly less than the minimum lithographic pitch supported by the lithography infrastructure being used.

Figure 7A:
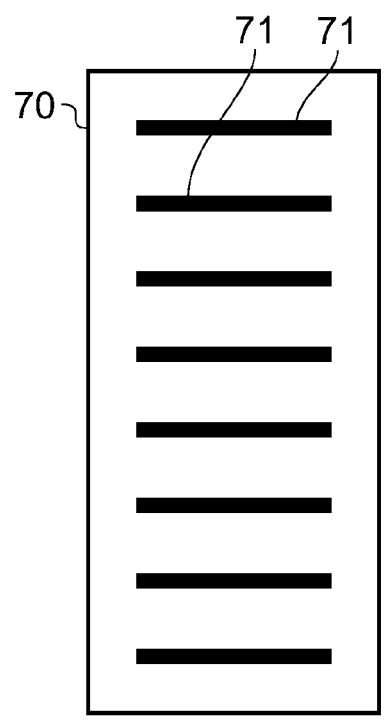
FIGS. 7a and 7b show first and second lithography masks suitable for a double patterning process used to define features of the finFET structures of FIG. 6b.
Figure 7B:
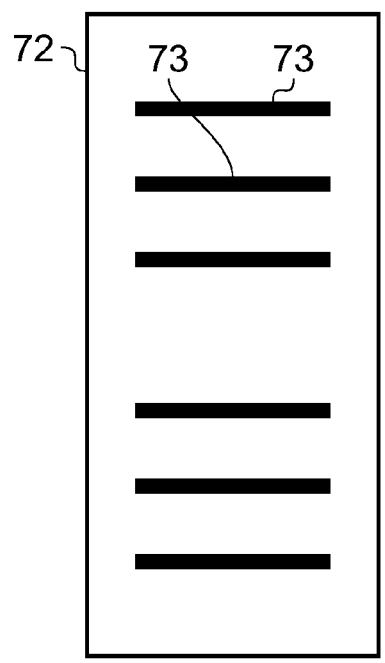

FIG. 7a shows a first mask 70 used to define a first group of fins 71. A second mask 72 as shown in FIG. 7b is used to define a second group of fins 73, each fin of which is interleaved between a pair of fins 71 of the first group of fins. Thus, the fins of the first mask are interspersed with fins of the second mask resulting in a greater spatial frequency of features than that defined in each of the first and second mask patterns. The expression 'interspersed' is intended to encompass the fins 73 of the second mask 72 being inserted between the fins 71 of the first mask 70. In a preferred arrangement, as shown in the figures, the interleaving of the fins 71 and 73 results in an alternating pattern with regular pitch.

Figure 7C:
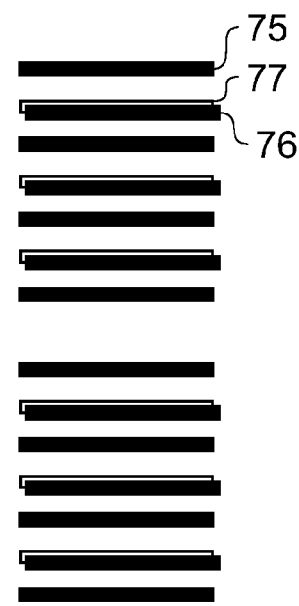
FIG. 7c shows the resulting resist pattern using the masks of FIGS. 7a and 7b with a double patterning process.

As described in connection with FIG. 1, a first resist layer is exposed with the first mask 70 and developed to leave a corresponding fin pattern 71 in the first resist layer. The patterned first resist layer is then covered with the protection cap 15 (FIGS. 1-5 and 1-6). The substrate is then coated with a second resist layer and this second resist layer is exposed with the second mask 72 and developed to leave a corresponding fin pattern 73 in the second resist layer. The combined resist pattern is shown in FIG. 7c which can then be etched into the silicon or other device layer to form the fins of transistors 65, 66 (FIG. 6b).

Generally speaking, the alignment tolerances required to register the first and second masks 70, 72 together are sufficiently controllable (e.g. less than 5 nm). A small amount of mis-registration is indicated in shadow outline in FIG. 7c is readily tolerated, where the intended position 77 of fin 76 is slightly offset from the intended relationship with fin 75. This has low impact on the device critical dimensions.

In a more general aspect, it is noted that the double patterning technique in this context can be applied to the fabrication of any device structure in which a first mask is configured to define a first group of periodic features having a first spatial frequency and in which a second mask is configured to define a second group of periodic features having a second spatial frequency. The first and second masks are registered relative to one another so as to result in features of the first and second groups together being defined at a third spatial frequency higher than the first or second spatial frequencies. In preferred examples, e.g. as shown in FIG. 7, the first and second spatial frequencies are the same and the third spatial frequency is exactly double that of the first and second spatial frequencies.

It will also be recognised that the processes described here extend to third or subsequent patterns, e.g. a triple patterning technique. In other words, a first mask is configured to define a first group of periodic features having a first spatial frequency, a second mask is configured to define a second group of periodic features having a second spatial frequency and a third mask is used to define a third group of periodic features having a third spatial frequency. The first, second and third masks are registered relative to one another so as to result in features of the first, second and third groups together being defined at a fourth spatial frequency higher than the first, second or third spatial frequencies. Again, in a preferred example, the first, second and third spatial frequencies are the same and the fourth spatial frequency is exactly three times that of the first, second and third spatial frequencies.

Providing the stability of the protection cap can be maintained through multiple processes, the principle is extensible to fourth and further patterning processes.

Other embodiments are intentionally within the scope of the accompanying claims.

The invention claimed is:

1. A method of forming a pattern in at least one device layer in or on a substrate comprising the steps of:
   a) coating the device layer with a first photoresist layer;
   b) exposing the first photoresist using a first mask;
   c) developing the first photoresist layer to form a first pattern on the substrate;
   d) coating the substrate with a protection layer;
   e) treating the protection layer to cause a change therein where it is in contact with the first photoresist, to render the changed protection layer substantially immune to a subsequent exposure and/or developing step;
   f) coating the substrate with a second photoresist layer;
   g) exposing the second photoresist layer using a second mask; and
   h) developing the second photoresist layer to form a second pattern on the substrate without significantly affecting the first pattern in the first photoresist layer,
   i) wherein the first and second patterns together define interspersed features having a spatial frequency greater than that of the features defined in each of the first and second patterns separately.

2. The method of claim 1 in which step e) comprises a bake at elevated temperature to cross-link the protection layer.

3. The method of claim 1 in which step e) includes promoting cross-linking in the protection layer by a catalyst provided from the first photoresist layer.

4. The method of claim 3 in which the catalyst provided by the first photoresist layer is an acid which diffuses into the protection layer.

5. The method of claim 1 in which the first photoresist is a photoresist adapted for patterning using electromagnetic radiation in the UV spectrum below 200 nm.

6. The method of claim 1 in which the first photoresist comprises acrylates.

7. The method of claim 1 further including, after step e) and prior to step f), removing parts of the protection layer unchanged by step e).

8. The method of claim 1 applied in the fabrication of a device structure, in which the first mask is adapted to define horizontal features in a device and in which the second mask is adapted to define vertical features in the device, the horizontal and vertical features being defined in the same device layer and intersecting at selected locations.

9. The method of claim 1 applied in the fabrication of a device structure, in which the first mask is configured to define a first group of periodic features having a first spatial frequency and in which the second mask is configured to define a second group of periodic features having a second spatial frequency, wherein the first and second masks are registered relative to one another so as to result in features of the first and second groups together being defined at a third spatial frequency higher than the first or second spatial frequencies.

10. The method of claim 1, wherein the step of coating the substrate with the second photoresist layer includes coating the protective layer and first photoresist layer.

11. The method of claim 1, further including a step of applying a second protective layer on the second photoresist pattern to achieve the same dimensions as the first photoresist layer and protective layer.

12. A method of forming a pattern in at least one device layer in or on a substrate comprising, in the fabrication of a finFET structure, the steps of:
   coating the device layer with a first photoresist layer;
   exposing the first photoresist using a first mask configured and arranged to define the fins of a finFET;
   developing the first photoresist layer to form a first pattern on the substrate;
   coating the substrate with a protection layer;
   treating the protection layer to cause a change therein where it is in contact with the first photoresist, to render at least a portion of the changed protection layer immune to a subsequent exposure and/or developing step;
   coating the substrate with a second photoresist layer;
   exposing the second photoresist layer using a second mask configured and arranged to define common source regions and common drain regions interconnecting the fins in the same device layer; and
   developing the second photoresist layer to form a second pattern on the substrate,
   wherein the first and second patterns together define interspersed features having a spatial frequency greater than that of the features defined in each of the first and second patterns separately.

13. The method of claim 12 in which the first mask is configured to define fins for multiple finFET devices with fins for multiple devices maintaining a substantially constant pitch both within individual devices and between adjacent devices.

14. The method of claim 13 in which the second mask is configured to provide breaks in the common source regions and/or the common drain regions at selected locations where fins are not required in the finFET devices, so as to prevent interconnection to fins at those selected locations.

15. A method of forming a pattern in at least one device layer in or on a substrate comprising, in the fabrication of a finFET structure, the steps of:
   coating the device layer with a first photoresist layer;
   exposing the first photoresist using a first mask configured and arranged to define a first group of fins of a finFET;
   developing the first photoresist layer to form a first pattern on the substrate;
   coating the substrate with a protection layer;
   treating the protection layer to cause a change therein where it is in contact with the first photoresist, to render at least a portion of the changed protection layer immune to a subsequent exposure and/or developing step;
   coating the substrate with a second photoresist layer;
   exposing the second photoresist layer using a second mask configured and arranged to define a second group of fins of a finFET, the first and second sets of fins being interspersed; and
   developing the second photoresist layer to form a second pattern on the substrate,
   wherein the first and second patterns together define interspersed features having a spatial frequency greater than that of the features defined in each of the first and second patterns separately.

16. The method of claim 15 in which the first group of fins and the second group of fins are interleaved in an alternating pattern.

17. The method of claim 16 in which the fins in the first group are separated by a first pitch distance, the fins in the second group are also separated by a first pitch distance and the combined fins of the first and second groups are separated by a second pitch distance of approximately half the first pitch distance.

* * * * *